United States Patent
Corti et al.

(10) Patent No.: US 7,191,305 B2
(45) Date of Patent: Mar. 13, 2007

(54) METHOD AND APPARATUS FOR ADDRESS DECODING OF EMBEDDED DRAM DEVICES

(75) Inventors: William D. Corti, New Windsor, NY (US); Joseph O. Marsh, Poughkeepsie, NY (US); Michael Won, Highland, NY (US)

(73) Assignee: International Business Machines Corporation, Armonk, NY (US)

( * ) Notice: Subject to any disclaimer, the term of this patent is extended or adjusted under 35 U.S.C. 154(b) by 208 days.

(21) Appl. No.: 10/952,269

(22) Filed: Sep. 28, 2004

(65) Prior Publication Data

US 2005/0044337 A1 Feb. 24, 2005

Related U.S. Application Data

(62) Division of application No. 09/940,262, filed on Aug. 28, 2001, now Pat. No. 6,834,334.

(51) Int. Cl.
*G06F 12/00* (2006.01)
(52) U.S. Cl. .................................. 711/202; 711/105
(58) Field of Classification Search ................ 711/104, 711/105, 202
See application file for complete search history.

(56) References Cited

U.S. PATENT DOCUMENTS

| | | | | |
|---|---|---|---|---|
| 5,822,268 A | | 10/1998 | Kirihata | 365/230.03 |
| 5,860,076 A | * | 1/1999 | Greene et al. | 711/1 |
| 5,901,304 A | | 5/1999 | Hwang et al. | 395/500 |
| 5,918,242 A | | 6/1999 | Sarma et al. | 711/5 |
| 5,949,732 A | | 9/1999 | Kirihata | 365/230.03 |
| 5,959,911 A | | 9/1999 | Krause et al. | 365/201 |
| 6,011,727 A | | 1/2000 | Merritt et al. | 365/189.02 |
| 6,026,470 A | * | 2/2000 | Arimilli et al. | 711/128 |

(Continued)

FOREIGN PATENT DOCUMENTS

WO WO 99/48097 9/1999

OTHER PUBLICATIONS

M. Zhang et al.; "A Programmable BIST For Embedded SDRAM;" IEEE; 2001; pp. 244-248.

(Continued)

*Primary Examiner*—B. James Peikari
*Assistant Examiner*—Woo H. Choi
(74) *Attorney, Agent, or Firm*—Robert A. Walsh; Cantor Colburn LLP

(57) ABSTRACT

A method for decoding a memory array address for an embedded DRAM (eDRAM) device is disclosed, the eDRAM device being configured for operation with an SDRAM memory manager. In an exemplary embodiment of the invention, the method includes receiving a set of row address bits from the memory manager at a first time. A set of initial column address bits is then subsequently from the memory manager at a later time. The set of initial column address bits are translated to a set of translated column address bits, and the set of row address bits and the set of translated column address bits are simultaneously used to access a desired memory location in the eDRAM device. The desired memory location in the eDRAM device has a row address corresponding to the value of the set of row address bits and a column address corresponding to the value of the set of translated column address bits.

4 Claims, 4 Drawing Sheets

U.S. PATENT DOCUMENTS

| | | | |
|---|---|---|---|
| 6,034,900 A | 3/2000 | Shirley et al. | 365/190 |
| 6,226,738 B1 | 5/2001 | Dowling | 712/225 |
| 6,260,127 B1 | 7/2001 | Olarig et al. | 711/167 |
| 6,584,036 B2 | 6/2003 | Kurjanowicz et al. | 365/233 |
| 6,625,081 B2 * | 9/2003 | Roohparvar et al. | 365/230.03 |
| 6,629,219 B1 | 9/2003 | Manseau | 711/157 |

OTHER PUBLICATIONS

T. Yamauchi et al.; "Design Methodology of Embedded DRAM with Virtual-Socket Architecture;" IEEE Journal of Solid-State Circuits, vol. 36, No. 1, Jan. 2001; pp. 46-54.

* cited by examiner

METHOD AND APPARATUS FOR ADDRESS DECODING OF EMBEDDED DRAM DEVICES

CROSS REFERENCE TO RELATED APPLICATIONS

The present application is a divisional application of U.S. patent application, Ser. No. 09/940,262, filed Aug. 28, 2001, now U.S. Pat. No. 6,834,334, the contents of which are incorporated herein by reference in their entirety.

BACKGROUND

The present invention relates generally to integrated circuit memory devices and, more particularly, to a method and apparatus for address decoding of embedded DRAM (eDRAM) devices.

As a result of the package/pin limitations associated with discrete, self-contained devices such as DRAMs, memory circuit designers have used certain multiplexing techniques in order to access the large number of internal memory array addresses through the narrow, pin-bound interfaces. Because these discrete DRAMs have been in use for some time, a standard interface has understandably emerged over the years for reading and writing to these arrays.

More recently, embedded DRAM (eDRAM) macros have been offered, particularly in the area of Application Specific Integrated Circuit (ASIC) technologies. For example, markets in portable and multimedia applications such as cellular phones and personal digital assistants utilize the increased density of embedded memory for higher function and lower power consumption. Unlike their discrete counterparts, the eDRAM devices do not have the limited I/O pin interfaces with associated memory management circuitry. In fact, the typical I/O counts for eDRAM devices can number in the hundreds.

Another possible use for the newer eDRAM devices would be the ability to use them interchangeably with existing SDRAM modules, thereby forming a structure utilizing a standard SDRAM interface, but having an embedded memory module therein. Unfortunately, the memory array configurations for a standard SDRAM and an eDRAM are somewhat different. In addition, the existing multiplexing and addressing schemes used by a memory manager (e.g., a hard disk controller) are not suited for use with an eDRAM structure, particularly with regard to the addressing of the array. For example, the limited I/O pin interfaces in SDRAM memory management circuitry have resulted in the use of a "time shared" addressing method, wherein a row address is presented at an initial clock cycle and held in a register until the corresponding column address is presented at a later clock cycle. The eDRAM devices, on the other hand, do not make use of these time shared addressing techniques.

BRIEF SUMMARY

The above discussed and other drawbacks and deficiencies of the prior art are overcome or alleviated by method of translating initial column storage locations defined in a first memory array structure to corresponding storage locations in a second memory array structure. the first memory array structure has X columns associated therewith and is capable of storing an M-bit data word at each memory address therein. The second memory array structure has Y columns associated therewith and is capable of storing an N-bit data word at each memory address therein, wherein XM=YN, X>Y, and M<N. The method includes dividing the N-bit data word in each column associated with the second memory array structure into N/M word slices, each of the word slices serving as an M-bit storage location. Each initial column storage location is assigned to one of the word slices.

BRIEF DESCRIPTION OF THE DRAWINGS

Referring to the exemplary drawings wherein like elements are numbered alike in the several Figures.

DETAILED DESCRIPTION

Figure 1A:
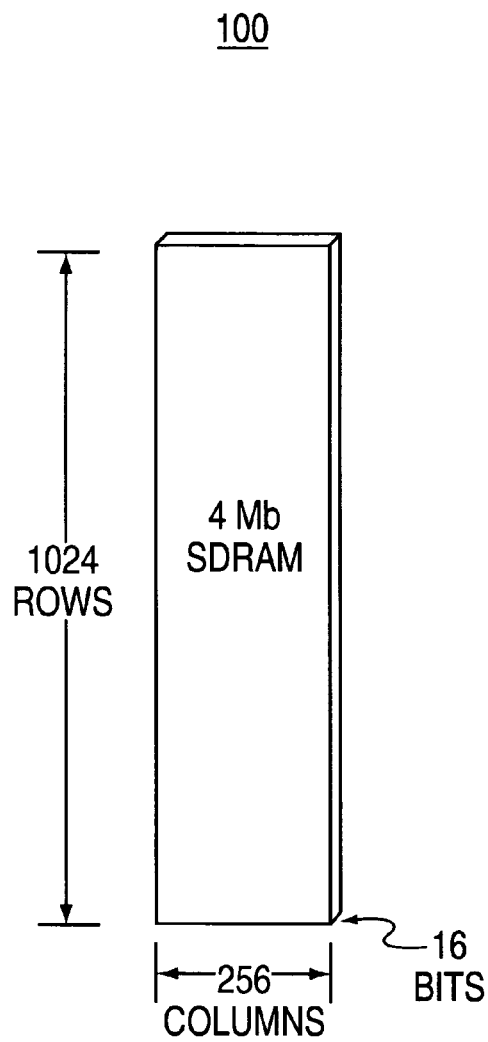
FIG. 1(a) is a three-dimensional representation of an existing 4 Mb SDRAM device targeted for replacement with an equivalent embedded memory device.
Figure 1B:
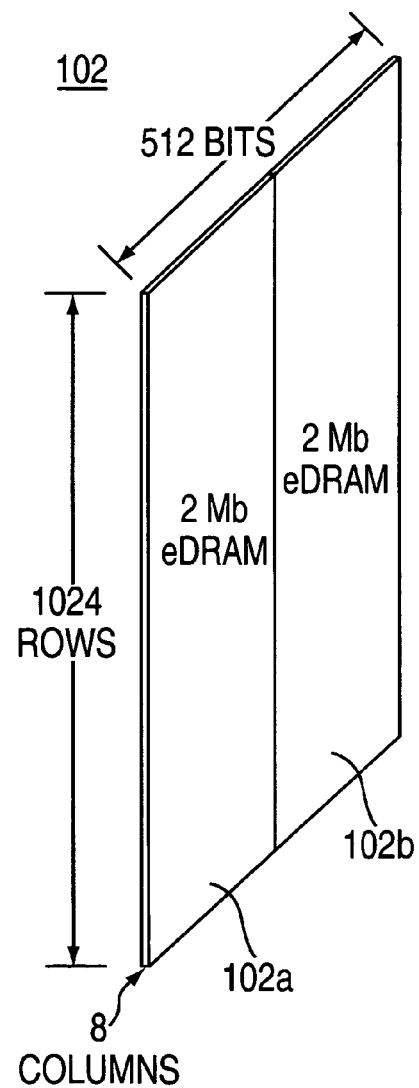
FIG. 1(b) illustrates an equivalent 4Mb embedded DRAM (eDRAM) device configured from two identical, 2Mb eDRAM modules.

Referring initially to FIG. 1(a), there is shown a three-dimensional representation of an existing 4Mb SDRAM device 100 targeted for substitution with an equivalent embedded memory device. As can be seen, the SDRAM 100 has a row depth of 1024 locations, along with a page structure of 256 columns×16 bits. In contrast, FIG. 1(b) illustrates an equivalent 4Mb embedded DRAM (eDRAM) device 102 which is configured from two identical, 2Mb eDRAM modules. A first eDRAM module 102a is linked with a second eDRAM module 102b such that the second eDRAM module 102b is "stacked" behind first eDRAM module 102a.

It is readily apparent that the array structure of SDRAM 100 is different from the array structure of eDRAM 102. Although eDRAM 102 does have an identical row depth of 1024 locations, it also has a different page structure of 8 columns×512 bits (256 bits each for first eDRAM module 102a and second eDRAM module 102b). Thus, a request for information stored in a particular row and column address in SDRAM format must be converted to a corresponding address location in the configured eDRAM device 102 shown in FIG. 1(b).

Therefore, in accordance with an embodiment of the invention, a method and apparatus is disclosed wherein an embedded DRAM device may be configured for compatible use with existing SDRAM memory manager formats. Broadly stated, an initial row address presented by an SDRAM memory manager is held until a corresponding column address is presented at a later time. This scheme of delayed addressing is common with standard SDRAM hardware devices. Then, when the column address is received during a later clock cycle, the row and column addresses are combined and simultaneously applied to access the appropriate memory element within the eDRAM array. The column address bits initially received from the SDRAM memory manager are processed so as to result in a translated address location for the interfacing eDRAM device.

Figure 2A:
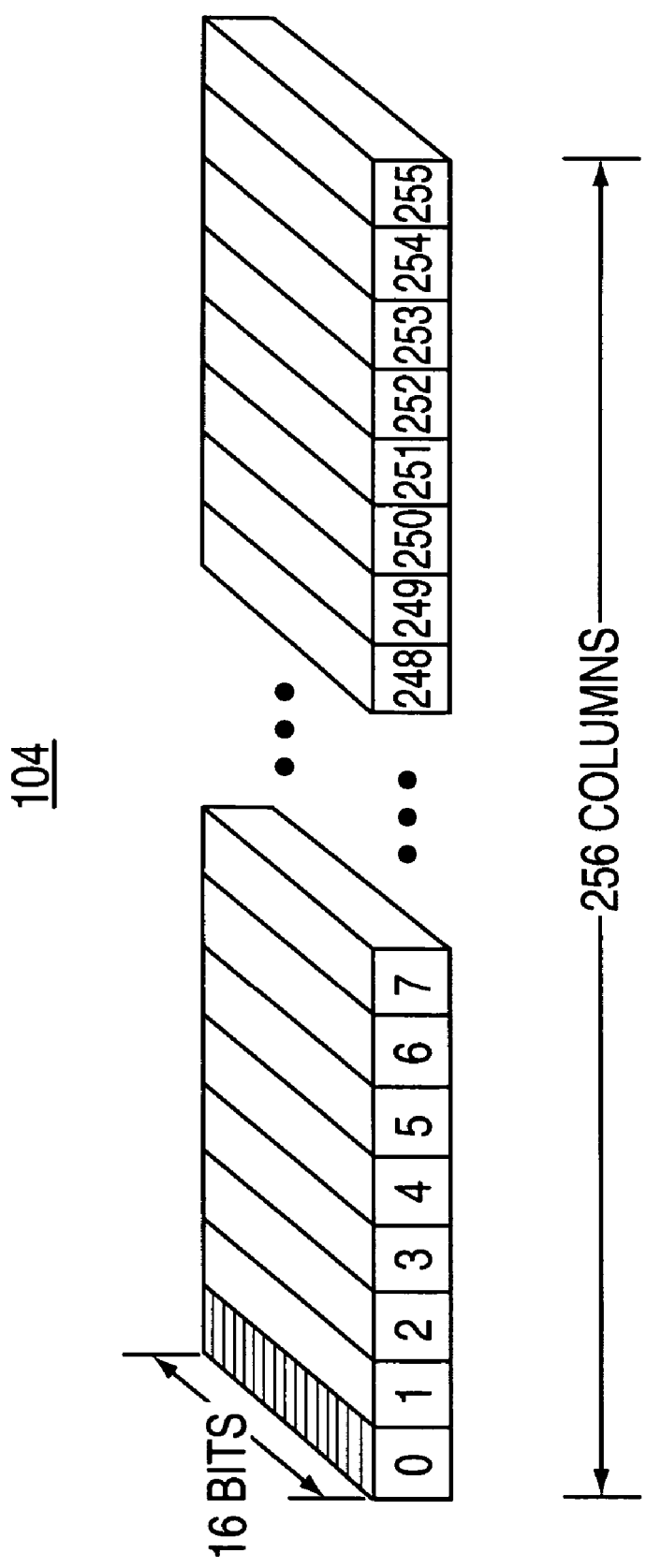
FIG. 2(a) is a three dimensional representation of a page structure for a given row the SDRAM device in FIG. 1(a)
Figure 2B:
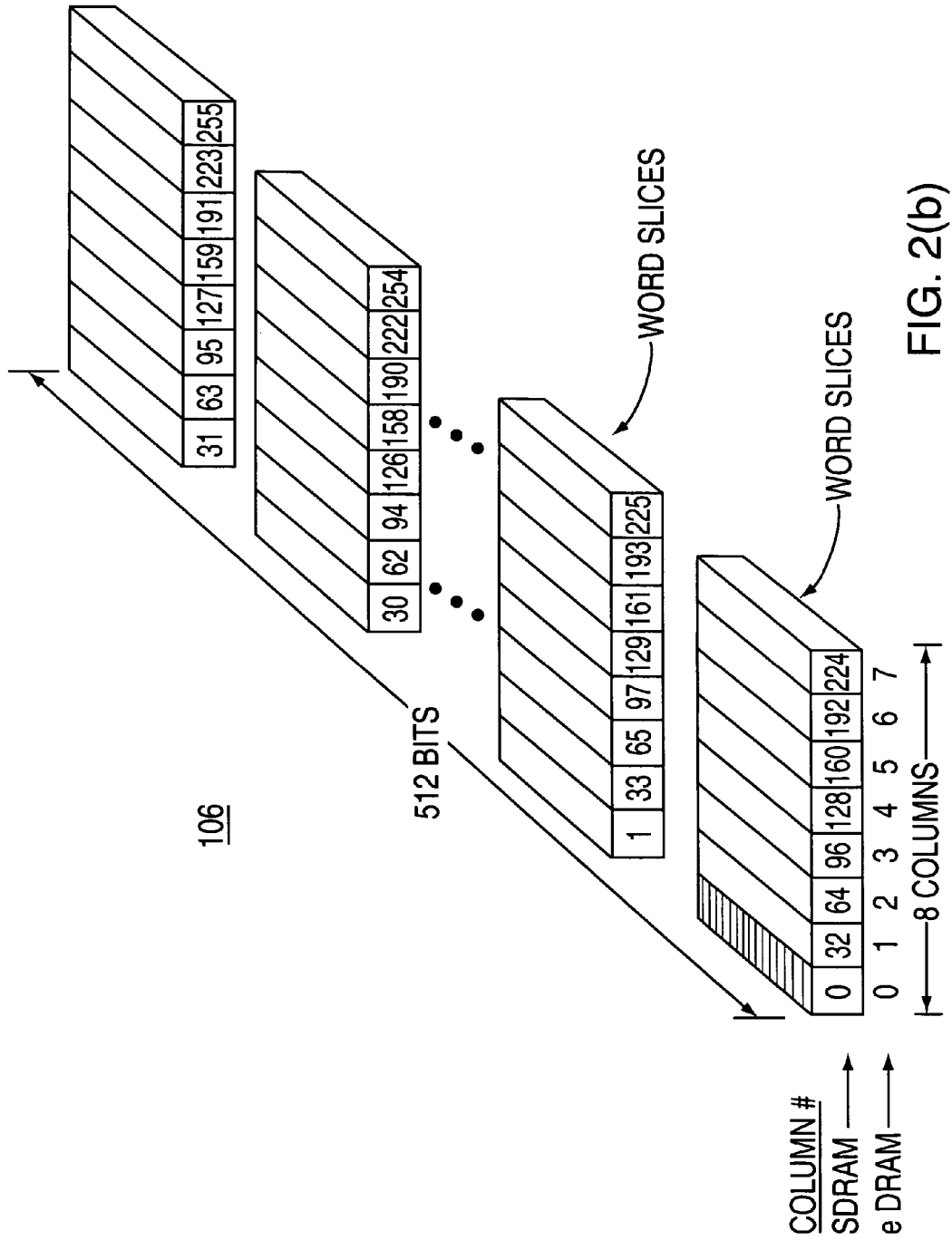
FIG. 2(b) is a three dimensional representation of a page structure for a given row the eDRAM device in FIG. 1(b), illustrating a reallocation of SDRAM column addresses, in accordance with an embodiment of the invention.

In order to more particularly illustrate the presently disclosed address translation scheme, reference may be made to FIGS. 2(a) and 2(b). In FIG. 2(a), there is shown a three dimensional representation of a page structure 104 for a given row of the SDRAM device 100. Again, for a 4Mb SDRAM storage device, each of the 1024 rows will have 256 columns wherein 16 data bits may be stored at each address location. The columns are consecutively labeled 0–255. However, since there are only 8 columns in each row of eDRAM 102, the additional 248 columns that are recognized by the SDRAM control hardware will have to be "reallocated" within the page structure of the eDRAM 102. This reallocation is illustrated in the eDRAM page structure 106 shown in FIG. 2(b).

Since page structure 106 of configured eDRAM 102 allows the storage of 512 bits at each address location, this 512 bit storage capability is broken down into a series of 16 bit word slices or segments in each column. Thus, the amount of data stored in one column and row address in the eDRAM 102 will be equivalent to the amount of data stored in 32 columns of the SDRAM 100. As can be seen, the first 32 columns of the SDRAM page (0–31) are arranged from front to back in the first column (0) of the eDRAM page. The next 32 columns of the SDRAM page (32–63) are likewise arranged in the next column (1) of the eDRAM page, and so on.

It will be appreciated that this particular rearrangement of column locations from one memory structure to another represents only one possible embodiment thereof. Instead of arranging the SDRAM column address locations from front to back within each eDRAM column, the rearrangement could also have gone from side to side. As will now be described, the particular arrangement of reallocated SDRAM addresses in eDRAM affects the handling of the address bits received from an SDRAM controller.

Figure 3:
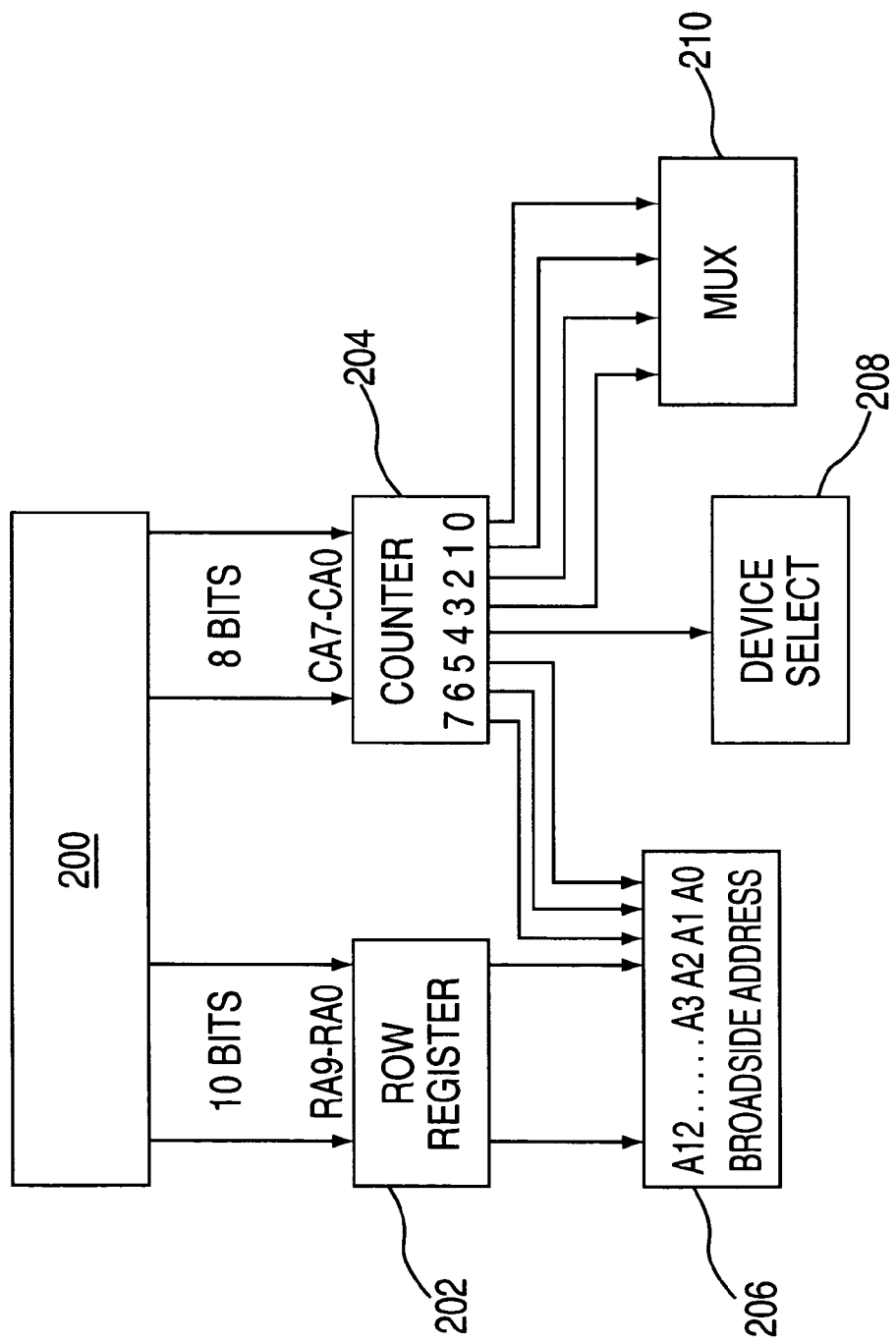
FIG. 3 is a block diagram illustrating an address decoding scheme for interfacing an SDRAM controller with the eDRAM array depicted in FIG. 1(b), in accordance with an embodiment of the invention.

Referring now to FIG. 3, there is shown a block diagram illustrating an address decoding scheme for interfacing an SDRAM controller (e.g., an external memory manager) with the eDRAM array depicted in FIG. 1(b). Again, due to the differences in array configurations as described above, a request for information in a particular row and column format will be converted to a corresponding location in the eDRAM array. Initially, the row address bits from a memory manager 200 are received and stored in a register 202. In standard SDRAM controllers, I/O pin limitations typically result in the complete transfer of address information bits over more than one clock cycle. On the other hand, with the speed of eDRAM, each access thereto can be accomplished in one clock cycle, even if it falls in a different eDRAM column.

Because there are 1024 ($2^{10}$) rows in the both the SDRAM and eDRAM array configurations, the 10 address bits (designated RA9–RA0) will be processed as is. In contrast, the 256 ($2^8$) column format recognized by SDRAM hardware means that there will be 8 column address bits (designated CA7–CA0) presented by memory manager 200 at a subsequent clock cycle. These bits are then loaded into a counter 204. The three most significant bits (7, 6 and 5) will join the ten row address bits as the translated eDRAM address in a broadside address register 206. Bit 4 will represent a selection bit for determining which of the two (2Mb) eDRAM modules 102a, 102b to access, and is fed from counter 204 to steering logic 208. Finally, the remaining four lowest order bits (3, 2, 1 and 0) are fed to a multiplexing device 210 for accessing the correct word slice within a 512 bit eDRAM column.

The specific distribution of the original column address bits stored in counter 204 will be understood with reference once again to FIG. 2(b). The value of the four least significant bits (3, 2, 1 and 0) in the originally presented column address sent to multiplexing device 210 determine which 16-bit word slice in a given column of a given eDRAM module will be accessed. For example, column number 0 in the SDRAM format corresponds to the original column, eight-bit binary address (00000000). Counting forward, it can be seen that the first 16 addresses (00000000–00001111) correspond to the first 16 word slices in column number 0 of the eDRAM array 102. Then, for the next sequential address (00010000), the lowest four SDRAM column address bits have reset to 0000, but the fifth bit (bit #4) is now 1. This means that SDRAM column address number 16 is located at the first word slice of the first column of the second eDRAM module 102b. Therefore, the fifth SDRAM column address bit (bit #4) determines which of the two eDRAM modules are accessed.

The next 16 word slices (addresses 00010000–00011111) complete the assignment of addresses in eDRAM column 0. Address 00100000 (SDRAM column number 32) is then assigned to the front of column number 1 in the eDRAM array. As this same pattern is completed through all 256 SDRAM column addresses, it becomes evident that the three most significant SDRAM column address bits (7, 6 and 5) determine which of the eight column locations in the eDRAM array is accessed.

For an illustrative example of the above described addressing scheme, it will be assumed that the SDRAM memory manager 200 is requesting access of stored information in row number 0, column number 95 of a 4Mb (1024 row×256 column) SDRAM memory array. The ten row address bits initially received into register 202 are, accordingly, (0000000000). These ten row address bits are then held in register 202 until the column address bits (in SDRAM format) are received from memory manager 200 into counter 204 during a later clock cycle. The binary value of the column address bits corresponding to column number 95, therefore, is (01011111).

Referring again to FIG. 2(b), it is seen how the present addressing scheme translates the initially transmitted column address bits in SDRAM format to a correctly reallocated column location in the eDRAM array. The three most significant bits (010) represent the translated column address for the eDRAM array and join the ten row address bits in broadside address register 206. Thus, column number 95 of the SDRAM array will correspond to column number 2 (binary 010) of the eDRAM array. The next bit in the SDRAM column address, being the eDRAM module selection bit, has a value of "1", signifying that column number 95 will further be found in column number 2 of the second (rearward) eDRAM module. Finally, the four least significant bits (1111) pinpoint the correct word slice in column 2 of the eDRAM array. As can be seen in FIG. 2(b), column number 95 is located at the last (sixteenth) word slice in the second column of the second eDRAM module 102.

Through the use of the above disclosed address translation scheme, it is seen how embedded DRAM devices may be made compatible with existing SDRAM products, without necessarily having to redesign the industry standard hardware associated with the SDRAM products. Although a 4Mb memory device is depicted, the particular memory size is exemplary only as the present invention embodiments are also applicable to various memory sizes. Furthermore, the principles of the invention may also be applied to a memory device that has a different row configuration, as well as a column configuration. In such a case, additional translational logic would implemented to convert a row address in one memory configuration to the corresponding row address in another memory configuration.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method of translating initial column storage locations defined in a first memory array structure to corresponding storage locations in a second memory array structure, the first memory array structure having X columns associated therewith and capable of storing an M-bit data word at each memory address therein, the second memory array structure having Y columns associated therewith and capable of storing an N-bit data word at each memory address therein, wherein XM=YN, X>Y, and M<N, the method comprising:

dividing the N-bit date word in each column associated with the second memory array structure into N/M word slices, each of said word slices serving as an M-bit storage location, said dividing comprising receiving a set of initial column address bits corresponding to said first memory array having X columns, and translating said set of initial column address bits to a set of translated column bits corresponding to said second memory array having Y columns; and assigning each initial column storage location to one or said word slices.

2. The method of claim 1, wherein said set of translated column bits further comprises a subset of said set of initial column address bits.

3. The method of claim 1, wherein said set of initial column address bits is received from a memory manager.

4. The method of claim 3, wherein said memory manager comprises a SDRAM memory interface, and said second memory array structure comprises an eDRAM device.

* * * * *